(12) United States Patent
Nomachi (10) Patent No.: US 8,592,882 B2
(45) Date of Patent: Nov. 26, 2013

(54) MAGNETIC RANDOM ACCESS MEMORY AND MANUFACTURING METHOD THEREOF

(75) Inventor: Akiko Nomachi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/235,223

(22) Filed: Sep. 16, 2011

(65) Prior Publication Data
US 2012/0187456 A1 Jul. 26, 2012

(30) Foreign Application Priority Data

Jan. 21, 2011 (JP) ................................ P2011-011357

(51) Int. Cl.
H01L 29/76 (2006.01)
H01L 29/94 (2006.01)
H01L 31/062 (2012.01)
H01L 31/113 (2006.01)
H01L 31/119 (2006.01)

(52) U.S. Cl.
USPC ................... 257/295; 257/396; 257/E21.067; 257/E21.027; 257/E21.077; 257/E21.19; 257/E21.218; 257/E21.304; 257/E21.267; 257/E21.17; 257/E21.645

(58) Field of Classification Search
USPC ......... 257/295, 288, 396, 411, 412, 382, 720, 257/774, E21.006, E21.027, E21.077, 257/E21.19, E21.218, E21.304, E21.267, 257/E21.17, E21.645
See application file for complete search history.

(56) References Cited

U.S. PATENT DOCUMENTS

| 6,881,351 B2 * | 4/2005 | Grynkewich et al. ............ 216/22 |
| 7,588,945 B2 * | 9/2009 | Min et al. .......................... 438/3 |
| 2009/0251951 A1 * | 10/2009 | Yoshikawa et al. ........... 365/158 |
| 2012/0075922 A1 | 3/2012 | Yamada et al. |

FOREIGN PATENT DOCUMENTS

| JP | 2009-049101 | 3/2009 |
| JP | 2009-239121 | 10/2009 |
| WO | WO 2010/134378 A1 | 11/2010 |

OTHER PUBLICATIONS

Korean Office Action dated Dec. 11, 2012 of corresponding Korean Patent Application No. 10-2011-0092999.

* cited by examiner

*Primary Examiner* — David Nhu
(74) *Attorney, Agent, or Firm* — Knobbe, Martens, Olson & Bear, LLP (57) ABSTRACT

According to one embodiment, there is disclosed a magnetic random access memory comprising: a semiconductor substrate; a selective transistor formed at the surface region of the semiconductor substrate and having a gate electrode, a gate insulating film, a source and a drain; and a magnetoresistive element formed on the drain including a magnetic storage layer in which a magnetization direction is variable, a magnetic reference layer in which a magnetization direction is fixed, and a nonmagnetic layer sandwiched between the magnetic storage layer and the magnetic reference layer.

27 Claims, 7 Drawing Sheets

Magnetic Random Access Memory and Manufacturing Method Thereof

MAGNETIC RANDOM ACCESS MEMORY AND MANUFACTURING METHOD THEREOF

CROSS-REFERENCE TO RELATED APPLICATIONS

This application is based upon and claims the benefit of priority from the prior Japanese Patent Application No. 2011-11357, filed on Jan. 21, 2011, the entire contents of which are incorporated herein by reference.

FIELD

Embodiments described herein relate generally to a magnetic random access memory and manufacturing method thereof.

BACKGROUND

Recently, a magnetic random access memory (MRAM) using tunneling magneto resistive (TMR) have been developed. The MRAM is configured with a magnetoresistive element including a magnetic tunnel junction (MTJ); therefore, a large magnetoresistance ratio is obtained.

In a recently discussed spin injection writing method, the direction of magnetization is reversed by injecting a current into a magnetoresistive element. When injecting a current into the magnetoresistive element, the current generally flows through a contact plug from a drain of metal-insulator-semiconductor field-effect transistor (MISFET). However, in this case, since the magnetoresistive element has parasitic resistances such as a contact resistance between the drain and the contact plug, a contact plug resistance itself, and a contact resistance between a contact plug and an electrode of the magnetoresistive element, the current value flowing to the magnetoresistive element from the drain may be small. This has confronted a problem that enough current can not be ensured to reverse the magnetization direction for the magnetoresistive element.

DETAILED DESCRIPTION

According to one embodiment of the present invention, there is disclosed a magnetic random access memory comprising: a semiconductor substrate including a surface region; a selective transistor formed at the surface region of the semiconductor substrate, and having a gate electrode, a gate insulating film, a source and a drain; and a storage element formed either on the source or the drain, including a magnetic storage layer in which a magnetization direction is variable, a magnetic reference layer in which a magnetization direction is fixed, and a nonmagnetic layer formed between the magnetic storage layer and the magnetic reference layer.

Embodiments of the present invention will be explained below with reference to the accompanying drawings. Note that in the following explanation, the same reference numerals denote elements having the same functions and arrangements.

<First Embodiment>

Figure 1:
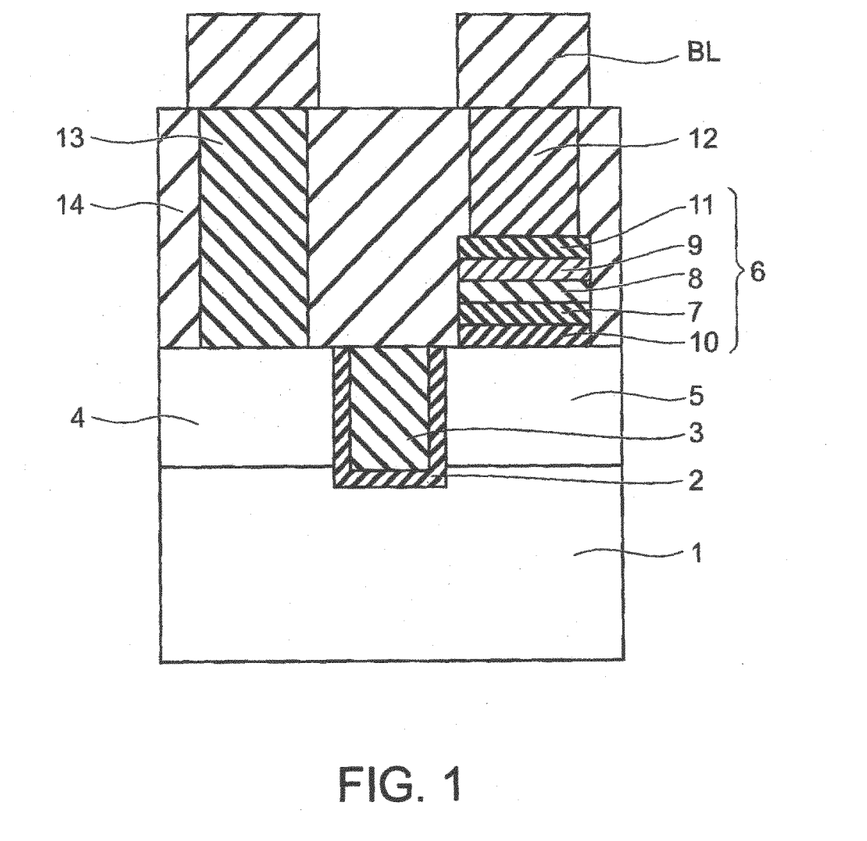
FIG. 1 is a sectional view showing a magnetic random access memory (MRAM) according to the first embodiment.
Figure 2:
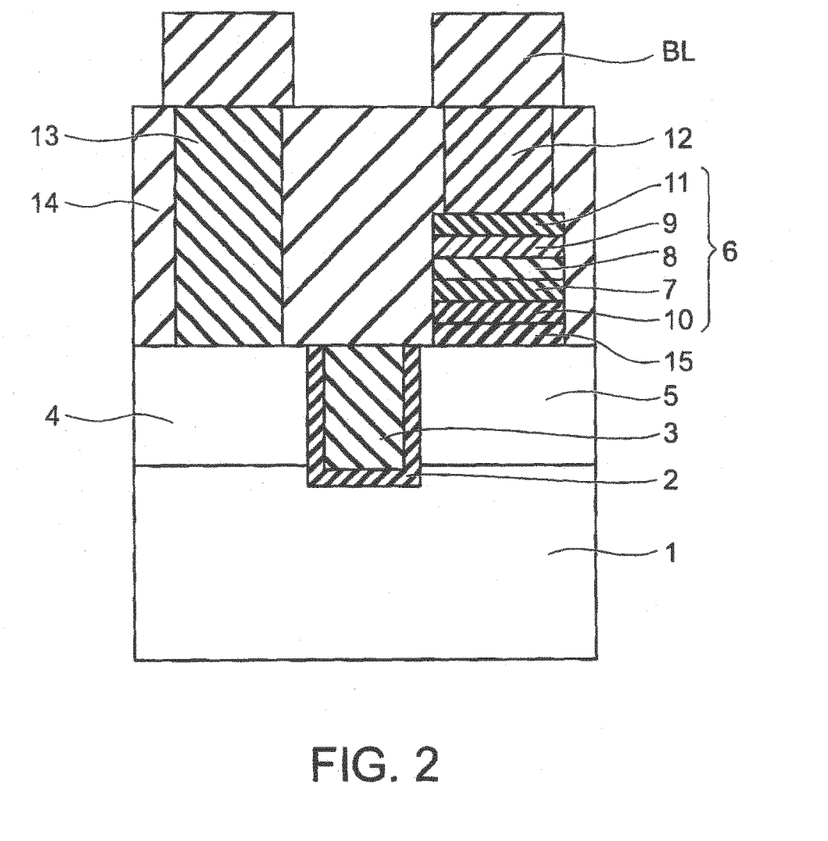
FIG. 2 is a sectional view showing the MRAM according to a modification of the first embodiment.

A magnetic random access memory according to the first embodiment will be explained below. FIG. 1 and FIG. 2 are sectional views illustrating a memory cell in the magnetic random access memory according to the first embodiment.

As shown in the FIG. 1, a selective transistor is embedded at a surface region of a semiconductor substrate, e.g., a silicon substrate 1. The selective transistor includes a gate insulating film 2, a gate electrode 3, a source diffusion layer 4, and a drain diffusion layer 5.

A p-type silicon substrate, for example, is used as the silicon substrate 1. The gate electrode 3 is embedded at the surface region of the silicon substrate 1. The gate electrode 3 is formed of, e.g., polysilicon or Tungsten (W). The gate insulating film 2 is embedded in the silicon substrate to surround the gate electrode 3. A silicon oxide film, for example, is used as the gate insulating film 2. Upper surfaces of the gate insulating film 2 and the gate electrode 3 have a substantially equal height to an upper surface of the silicon substrate 1, which is also equal to upper surfaces of the source diffusion layer 4 and the drain diffusion layer 5.

The source diffusion layer 4 and the drain diffusion layer 5 are formed at the surface region of the silicon substrate 1. The source diffusion layer 4 and the drain diffusion layer 5 are formed to sandwich the gate electrode 3 and the gate insulating film 2 therebetween. The source diffusion layer 4 and the drain diffusion layer 5 are, e.g., n-type diffusion layers. As described above, a buried type transistor embedded in the silicon substrate 1 is formed.

A magnetoresistive element 6 as a storage element is formed either on the source diffusion layer 4 or on the drain diffusion layer 5. In the present embodiment, the magnetoresistive element 6 is formed on the drain diffusion layer 5. The magnetoresistive element including at least a magnetic storage layer 7, a nonmagnetic layer 8, and a magnetic reference layer 9, is configured by sequentially laminating, e.g., a bottom electrode 10, the magnetic storage layer 7, the nonmagnetic layer 8, the magnetic reference layer 9, and a top electrode 11.

As the bottom electrode 10, e.g., Pt, Ir, Ru, Cu, Ta, W, or TiN is used.

The magnetic storage layer 7 is formed on the bottom electrode 10. The magnetic storage layer 7 is a perpendicular magnetic film of which the magnetization direction is substantially perpendicular to the film surface, and the magnetization direction is variable.

The nonmagnetic layer 8 as a tunnel insulating film is disposed on the magnetic storage layer 7. As the nonmagnetic layer 8, NaCl-type oxide, such as MgO, CaO, SrO, TiO, VO, NbO, or any other materials can be used.

The magnetic reference layer 9 is disposed on the nonmagnetic layer 8. The magnetic reference layer 9 is a perpendicular magnetic film of which the magnetization direction is substantially perpendicular to the film surface, and the magnetization direction is fixed to one direction. The magnetic reference layer 9 as the perpendicular magnetic film can be formed of a disordered alloy, an ordered alloy, or an artificial lattice. The disordered alloy is formed of an alloy of Co and an element selected from Cr, Ta, Nb, V, W, Hf, Ti, Zr, Pt, Pd, Fe, or Ni, e.g., CoCr or CoPt. The ordered alloy is formed of an alloy of Fe, Co, or Ni and Pt or Pd, e.g., a FePt, FePd, or CoPt. The artificial lattice is formed of a stack consisting of Fe, Co or Ni and an element selected from Cr, Pt, Pd, Ir, Rh, Ru, Os, Re or Au, or a stacked alloy thereof, e.g., Co/Pd, Co/Pt, or Co/Ru. Furthermore, an alloy material including a transition metal such as Tb, Dy, or GD, e.g., TbFe, TbCo, DyTbFeCo, or TbCoFe can also be used.

The top electrode 11, for example, is disposed on the magnetic reference layer 9. A film of e.g., Ru or Ta may be used as the top electrode. Then, a magnetic field canceling layer may be disposed on the magnetic reference layer 9. The magnetic field canceling layer has a role in adjusting leak field from the magnetic reference layer 9 in order to suppress the magnetic influence on the magnetic storage layer 7. As the magnetic field canceling layer, e.g., the disordered alloy, the ordered alloy, or the artificial lattice may be used. As the disordered alloy, an alloy made of Co mixed with an element selected from Cr, Ta, Nb, V, W, Hf, Ti, Zr, Pt, Pd, Fe, or Ni can be used.

Moreover, an antiferromagnetic layer may be formed on the magnetic field canceling layer to fix the magnetization direction of the magnetic field canceling layer to the predetermined one direction. As the antiferromagnetic layer, an alloy made of the combination of Fe, Ni, Pt, Pd, Ru, Os, Ir, and Mn, such as FeMn, NiMn, PtMn, PdMn, PtPdMn, RuMn, OsMn, IrMn, or CrPtMn can be used.

Furthermore, a first interface magnetic layer maybe disposed between the magnetic storage layer 7 and the nonmagnetic layer 8, and a second interface magnetic layer may be disposed between the nonmagnetic layer 8 and the magnetic reference layer 9. In this case, the nonmagnetic layer 8 is an oxide having a NaCl structure, and it is preferably chosen a material of which the degree of lattice mismatch between the (100) surface of the oxide and the first interface magnetic layer is small. As the first interface magnetic layer and the second magnetic layer, e.g., CO, Fe, CoFe, or CoFeB may be used. Each of the first interface magnetic layer and the second magnetic layer has a perpendicular magnetization, which is formed by the exchange coupling between the first interface magnetic layer and the magnetic storage layer 7, and between the second interface magnetic layer and the magnetic reference layer 9. In this case, if the nonmagnetic layer 8 has crystal growth on an amorphous CoFeB alloy as the first interface magnetic layer, a preferentially oriented insulating film to the (100) direction can be acquired.

In Addition, the stacking order in forming the magnetoresistive element 6 is not limited to the order described above; it may also be formed by the order of the bottom electrode 10, the magnetic field canceling layer, the magnetic reference layer 9, the first interface magnetic layer, the nonmagnetic layer 8, the second interface magnetic layer, the magnetic storage layer 7, and the top electrode 11.

Further, the magnetic storage layer 7 and the magnetic reference layer 9 may be the horizontal magnetic layers of which the magnetization direction is substantially horizontal to the film surfaces.

As shown in FIG. 2, a barrier layer 15 maybe disposed between the second diffusion layer 5 and the magnetoresistive element 6. The barrier layer 15 can prevent the metallic atoms in the magnetoresistive element from diffusing into the silicon substrate 1 by heat treatment process and the like.

A first contact plug 12 is disposed on the magnetoresistive element 6. As the first contact plug 12, e.g., W, or Cu is used.

A second contact plug 13 is formed on the source diffusion layer 4. As the second contact plug 13, e.g., W, or Cu is used.

An interlayer insulating film 14 is disposed on the silicon substrate 1 to embed the first contact plug 12 and the second contact plug 13. As the interlayer insulating film 14, e.g., silicon oxide is used. A plurality of bit lines BL are disposed on the first plug 12 and the second contact plug 13, independently.

An insulating film (not shown) is disposed on the interlayer insulating film 14 to overlay the bit lines BL. As the insulating film, e.g., silicon oxide is used.

As described above, the magnetic random access memory is configured according to the present embodiment.

According to the magnetic random access memory in the first embodiment as described above, the magnetoresistive element 6 as a storage element is disposed in direct contact on the drain diffusion layer 5 without a contact plug. This makes it possible to decrease parasitic resistances, such as a contact resistance between a drain diffusion layer and a contact plug, a contact plug resistance itself, and a contact resistance between a contact plug and an electrode of the magnetoresistive element 6, and thus to lead to ensure enough current flowing to the magnetoresistive element 6 from the drain diffusion layer 5.

Next, a manufacturing method of the magnetic random access memory will be explained below referring to FIG. 3A to FIG. 3G of the first embodiment. FIG. 3A to FIG. 3G are sectional views illustrating the manufacturing method of the magnetic random access memory according to the first embodiment.

Figure 3A:
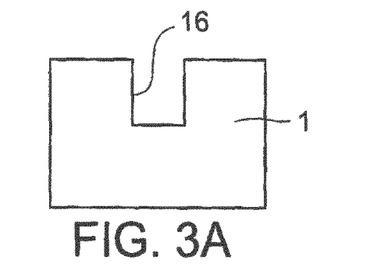
FIGS. 3A-3G are sectional views showing a manufacturing method of the MRAM according to the first embodiment.

As shown in FIG. 3A, the gate groove is formed in the silicon substrate 1 which were isolated by element isolation regions (not shown) using a photolithography method and RIE (Reactive Ion Etching).

Figure 3B:
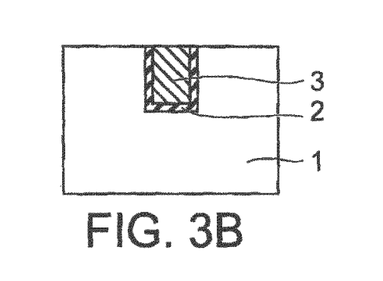

As shown in FIG. 3B, a silicon oxide film as the gate insulating film 2 is formed along an upper surface of the silicon substrate 1 and the gate groove 16 by, e.g., thermal oxidation method. Then, a polysilicon film or a metal film of, e.g., W as the gate electrode 3, is deposited on the gate insulating film 2 until the gate groove 16 is fully embedded. After that, the gate insulating film 2 and the gate electrode 3 are polished until the silicon substrate 1 is exposed by CMP (Chemical Mechanical Polishing) method.

Figure 3C:
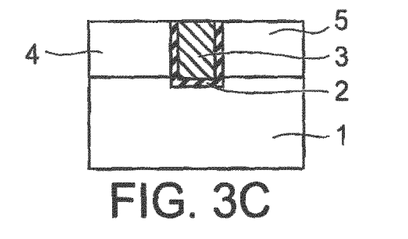

As shown in FIG. 3C, an ion implantation is performed to the silicon substrate 1 using the gate electrode 3 and the gate insulating film 2 as a mask to form the source diffusion layer 4 and the drain diffusion layer 5 on the surface region of the silicon substrate 1.

As described above, a buried type transistor is formed in the silicon substrate. The methods of manufacturing the buried type transistor are not limited to the methods described above, but rather any other methods can also be used.

Figure 3D:
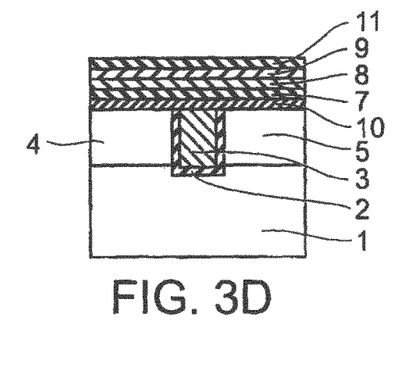

As shown in FIG. 3D, a stacked layer including at least the magnetic storage layer 7, the nonmagnetic layer 8 and the magnetic reference layer 9 is deposited on the silicon substrate 1, the gate insulating film 2, and the gate electrode 3 by, e.g., sputtering method. The stacked layer is configured by sequentially laminating, e.g., a bottom electrode 10, the magnetic storage layer 7, the nonmagnetic layer 8, the magnetic reference layer 9, and the top electrode 11. The stacked layer may also be configured by sequentially laminating the bottom electrode 10, the magnetic storage layer 7, the first interface magnetic layer, the nonmagnetic layer 8, the second interface magnetic layer, the magnetic reference layer 9, and the top electrode 11. The stacked layer may also be configured by sequentially stacking the bottom electrode 10, the magnetic reference layer 9, the nonmagnetic layer 8, the magnetic storage layer 7, and the top electrode 11. Te stacked layer may also be configured by sequentially laminating the bottom electrode 10, the magnetic reference layer 9, the first interface magnetic layer, the nonmagnetic layer 8, the second interface magnetic layer, the magnetic storage layer 7 and the top electrode 11. In the manufacturing methods of the magnetic random access memory according to the present embodiment, the stacked layer including at least the magnetic storage layer 7, the nonmagnetic layer 8, and the magnetic reference layer 9 can be formed on a highly flat surface by using a buried type transistor.

Figure 3E:
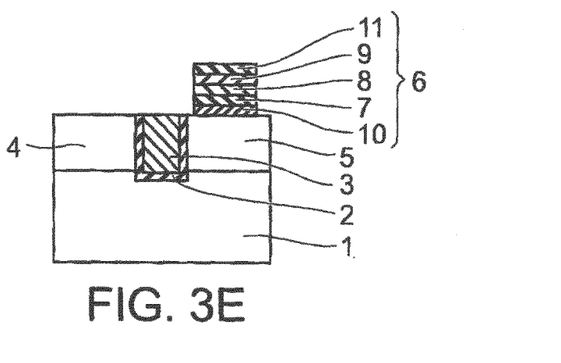

As shown in FIG. 3E, while leaving some part of the stacked layer on the drain diffusion layer, other parts of the stacked layer are selectively removed until the silicon substrate is exposed by RIE. Thus, the magnetoresistive element 6 including at least the magnetic storage layer 7, the nonmagnetic layer 8 and the magnetic reference layer 9 is formed on the drain diffusion layer 5.

Figure 3F:
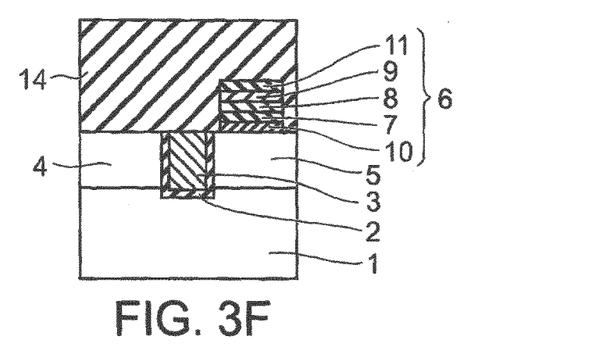

As shown in FIG. 3F, an interlayer insulating film 14 is formed on the silicon substrate 1, the gate insulating film 2, and the gate electrode 3 so as to overlay the magnetoresistive element 6.

Figure 3G:
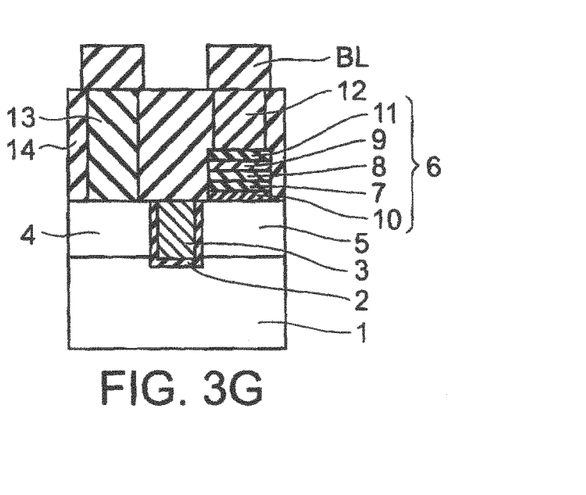

As shown in FIG. 3G, some part of the interlayer insulating film 14 is selectively removed until the magnetoresistive element 6 is exposed to form a first contact hole by RIE, and other parts of the interlayer insulating film 14 is selectively removed until the source diffusion layer 4 is exposed to form a second contact hole by RIE.

Then, a metal barrier film (not shown) is formed on the silicon substrate 1 and along a lateral surface of the interlayer insulating film 14 in the second contact hole by using, e.g., a sputtering method. As the metal barrier film, e.g., Ta, TaN, or TiN is used.

A contact plug material of e.g., W, or Cu is embedded on the metal barrier film (not shown) by CVD or sputtering method. Then the contact plug material and the metal barrier film are polished down until the interlayer insulating film 14 is exposed by CMP process. Consequently, a first contact plug 12 and the second contact plug 13 are formed.

Moreover, bit lines BL are deposited on the first contact plug 12, the second contact plug 13 and the interlayer insulating film 14. Then, an insulating layer (not shown) is formed on the interlayer insulating film 14 to overlay the bit lines BL. The insulating film (not shown) is, e.g., a silicon oxide film deposited by CVD method.

As described in details above, the magnetoresistive element is formed.

According to the manufacturing method of the magnetoresistive element in the first embodiment as explained above, an upper surface of the gate electrode, and an upper surface of the source diffusion layer 4 and the drain diffusion layer 5 are formed in substantially the same height by forming a buried type transistor embedded in the silicon substrate 1. Therefore, the stacked layer including at least the magnetic storage layer 7, the nonmagnetic layer 8, and the magnetic reference layer 9 can be formed on a highly flat surface, which leads to produce a highly flat magnetoresistive element 6.

According to the first embodiment as explained above, the magnetoresistive element 6 as a storage element is formed in direct contact on the drain diffusion layer 5 without a contact plug. Since this method allows to reduce parasitic resistances, such as a contact resistance between the drain and the contact plug, a contact plug resistance itself, and a contact resistance between a contact plug and an electrode of the magnetoresistive element, enough current flowing from the drain diffusion layer 5 to the magnetoresistive element 6 can be ensured.

<Second Embodiment>

Figure 4:
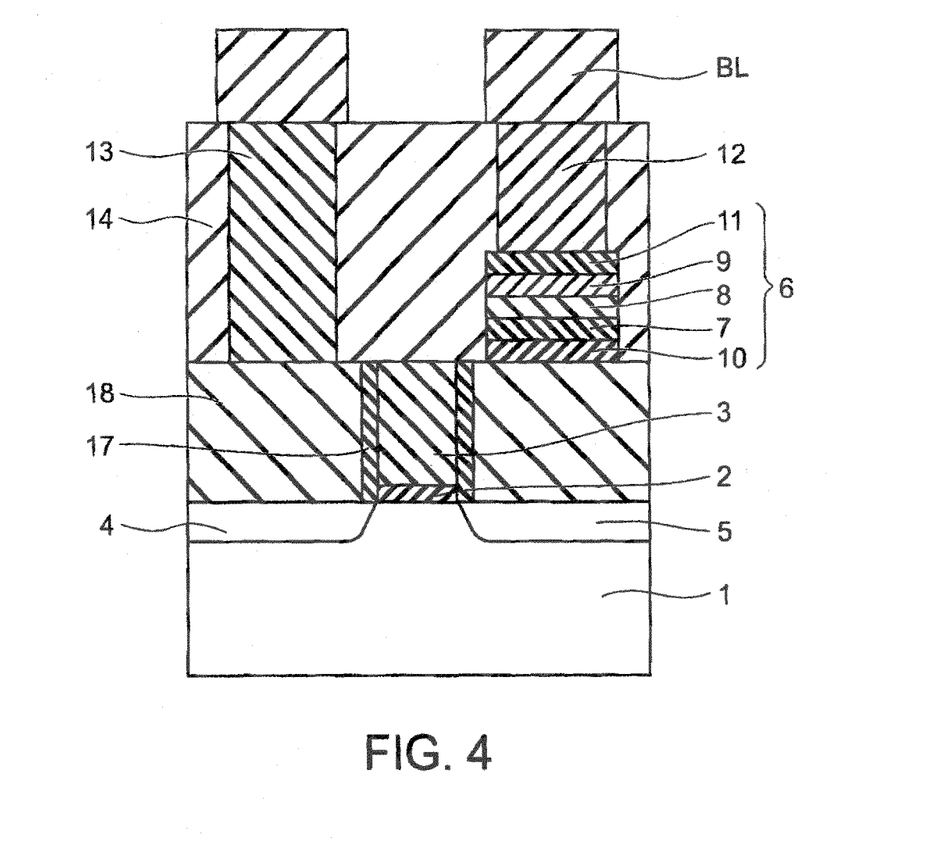
FIG. 4 is a sectional view showing a magnetic random access memory (MRAM) according to the second embodiment.

A magnetic random access memory will be described below with FIG. 4 according to the second embodiment. Note that in the following explanation, the same reference numerals denote elements having the same functions and arrangements as the first embodiment described with FIG. 1, and detailed explanation will be omitted.

A magnetic random access memory according to the second embodiment has in common in terms of using a buried type transistor with that of the first embodiment. On the other hand, the second embodiment differs from the first embodiment in that the buried type transistor is embedded in a semiconductor layer e.g., a silicon film 18, instead of being embedded in the silicon substrate 1 in the first embodiment. More specifically, the second embodiment differs in following ways: the gate insulating film 2 and the gate electrode 3 are formed on the silicon substrate 1 instead of being embedded in the silicon substrate 1, the gate sidewall insulating film 17 is formed in direct contact on the gate insulating film 2 and a lateral surface of the gate electrode 3, and the silicon film 18 is formed to overlay the lateral surface of the gate sidewall insulating film 17.

The magnetic random access memory will be explained below with FIGS. 5A-5C according to the second embodiment. Note that in the following explanation, the same reference numerals denote elements having the same functions and arrangements as the first embodiment described with FIG. 1, and detailed explanation will be omitted.

In the first embodiment, a buried type selective transistor is configured by forming a gate groove 16 in the silicon substrate 1 and embedding the gate insulating film 2 and the gate electrode 3 in the gate groove 16. In the second embodiment, on the other hand, the silicon film 18 is deposited on the silicon substrate 1 after forming the gate insulating film 2 and the gate electrode 3 on the silicon substrate 1.

Figure 5A:
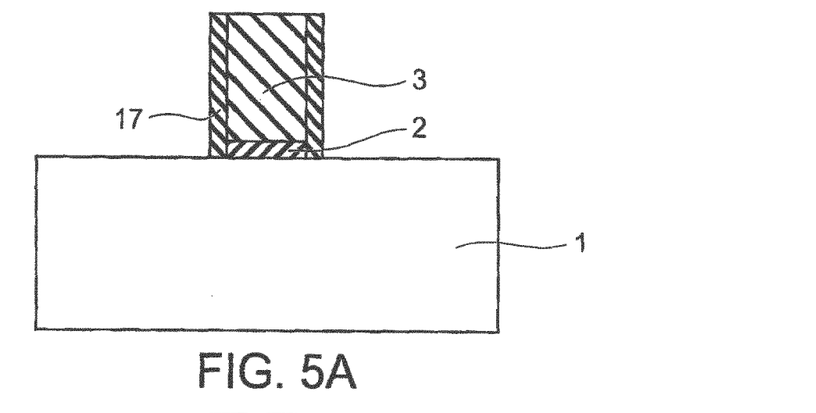
FIGS. 5A-5C are sectional views showing a manufacturing method of the MRAM according to the second embodiment.

As shown in FIG. 5A, a gate insulating layer (not shown) and a gate electrode layer (not shown) are deposited on the silicon substrate 1, and gate insulating film 2 and the gate electrode 3 are formed by photolithography method and RIE method. Then, as a gate sidewall insulating film material, e.g., a silicon oxide film is deposited to overlay the silicon substrate 1, the gate insulating film 2, and the gate electrode 3 by CVD method. Since the gate electrode 3 is etched subsequently until the surface thereof is exposed by RIE method, the gate sidewall insulating film 17 is formed to directly contact on a lateral surface of the gate insulating film 2 and the gate electrode 3.

Figure 5B:
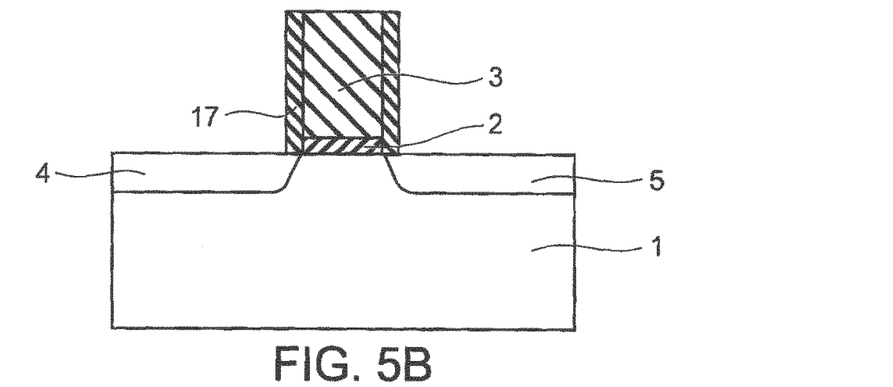

As shown in FIG. 5B, an ion implantation is performed to the silicon substrate 1 using the gate electrode 3 and the gate sidewall insulating film 17 as a mask to form the source diffusion layer 4 and the drain diffusion layer 5 on the surface region of the silicon substrate 1.

Figure 5C:
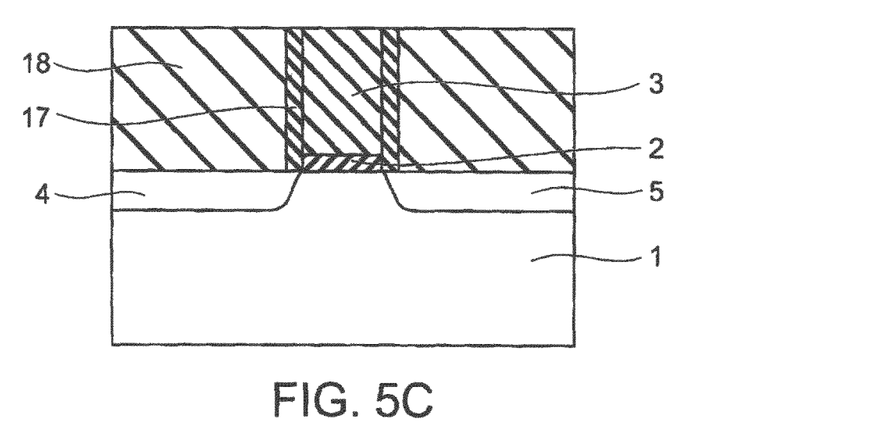

As shown in FIG. 5C, the silicon film 18 has epitaxially grown on the silicon substrate up to at least the height of the upper surface of the gate electrode 3 by CVD method. Then the silicon film 18 is polished until the surface of the gate electrode 3 is exposed by CMP process.

Consequently, a buried type transistor is formed in the silicon film 18. The source diffusion layer 4 and the silicon film 18 formed thereon serve as a source of the transistor, while the drain diffusion layer 5 and the silicon film 18 formed thereon serve as a drain of the transistor.

From these methods described hereinabove, a method for forming a buried type transistor is completed without embedding in the silicon substrate 1. This allows to form a buried type transistor without void and seam, which can be possibly generated if the transistor is formed by filling the gate insulating film 2 and the gate electrode 3, and if the procedure is conducted with a poor filling performance.

As shown as in FIGS. 3D and 3E of the first embodiment, the magnetoresistive element 6 as a storage element is formed on the silicon film 18 on the drain diffusion layer 5. As shown as in FIG. 3F of the first embodiment, the interlayer insulating film 14 is formed to overlay the magnetoresistive element 6. As shown as in FIG. 3G of the first embodiment, the first contact plug 12 is formed on the magnetoresistive element 6, and the second contact plug 13 is formed on the silicon film 18 on the source diffusion layer 4. After the bit lines BL are formed on the interlayer insulating film 4, the first contact plug 12 and the second contact plug 13, an insulating film (not shown) is formed on the interlayer insulating film 14 to overlay the bit lines BL.

As explained above, the magnetic random access memory according to the second embodiment is formed.

According to the second embodiment as described above, the magnetoresistive element 6 as a storage element is formed directly on the silicon film 18 disposed on the drain diffusion layer 5 without a contact plug. This makes it possible to decrease parasitic resistances, such as a contact resistance between a drain diffusion layer and a contact plug, a contact plug resistance itself, and a contact resistance between a contact plug and an electrode of the magnetoresistive element 6, and thus to lead to ensure enough current flowing to the magnetoresistive element 6 from the drain diffusion layer 5.

Moreover, according to the second embodiment, a buried type selective transistor is formed without filling the gate insulating film 2 and the gate electrode 3 in the silicon substrate 1. This enables to form a buried type selective transistor without void and seam, regardless of a filling performance when the gate insulating film 2 and the gate electrode 3 are embedded in the silicon substrate 1.

<Third Embodiment>

A magnetic random access memory will be explained below with FIG. 6 according to the third embodiment. Note that in the following explanation, the same reference numerals denote elements having the same functions and arrangements as the first embodiment described with FIG. 1, and detailed explanation will be omitted.

The third embodiment differs from the first embodiment in that the gate insulating film 2 and the gate electrode 3 are disposed on the silicon substrate 1, instead of being embedded in the silicon substrate.

A manufacturing method of the magnetic random access memory will be explained below referring to FIG. 7A to FIG. 7F according to the third embodiment.

Figure 7A:
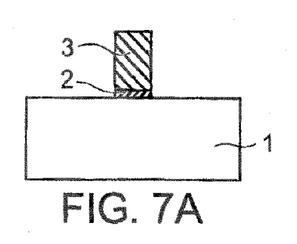
FIGS. 7A-7F are sectional views showing a manufacturing method of the MRAM according to the third embodiment.

As shown in FIG. 7A, a gate insulating layer (not shown) and a gate electrode layer (not shown) are deposited on the silicon substrate 1, and gate insulating film 2 and the gate electrode 3 are formed by photolithography method and RIE method.

Figure 7B:
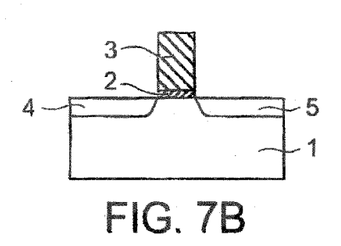

As shown in FIG. 7B, ion implantation is performed to the silicon substrate 1 using the gate electrode 3 as a mask to form the source diffusion layer 4 and the drain diffusion layer 6 in the surface region of the silicon substrate 1.

Figure 7C:
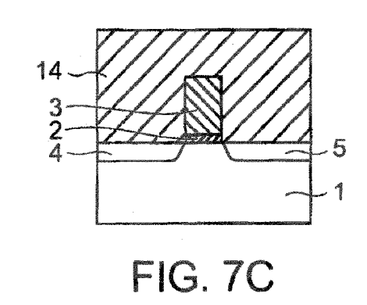

As shown in FIG. 7C, the interlayer insulating layer 14 is formed on the substrate 1 to overlay the gate insulating film 2 and the gate electrode 3.

Figure 7D:
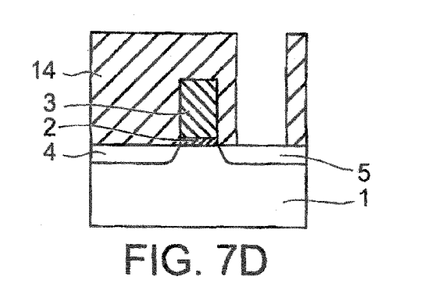

As shown in FIG. 7D, the interlayer insulating layer 14 is selectively removed until the drain diffusion layer 5 is exposed by RIE method to form a first contact hole. The first contact hole is a portion where magnetoresistive element 6 will be formed as will hereinafter be described.

Figure 7E:
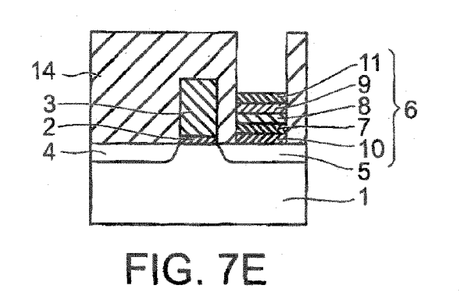

As shown in FIG. 7E, a stacked layer including at least the magnetic storage layer 7, the nonmagnetic layer 8 and the magnetic reference layer 9 is formed in the first contact hole on the drain diffusion layer 5 to form the magnetoresistive element 6 as a storage element, using e.g., gas cluster ion beam method. The magnetoresistive element 6 may also be formed by sputtering method. In this case, the process illustrated in FIG. 7D involves in forming a reversed taper-shaped first contact hole of which a width of an upper opening is narrower than that of a bottom opening. This can prevent magnetoresistive element 6 from forming along a sidewall of the interlayer insulating layer 14.

Figure 7F:
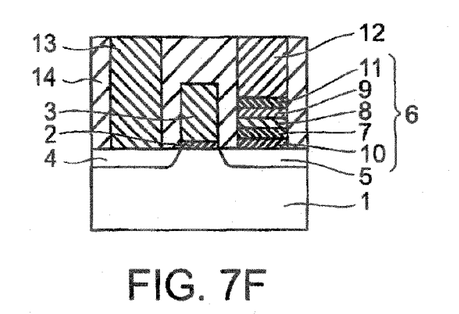

As shown in FIG. 7F, as a contact plug material, e.g., W film is deposited on the storage element and polished until the interlayer insulating film 14 is exposed by CMP process to form the first contact plug 12.

The interlayer insulating film 14 is selectively removed to expose the source diffusion layer 4. As a contact plug material, e.g., W film is then formed on the exposed source diffusion layer 4. Then, the contact plug material is polished until the interlayer insulating layer 14 is exposed to form the second contact plug 13.

Figure 6:
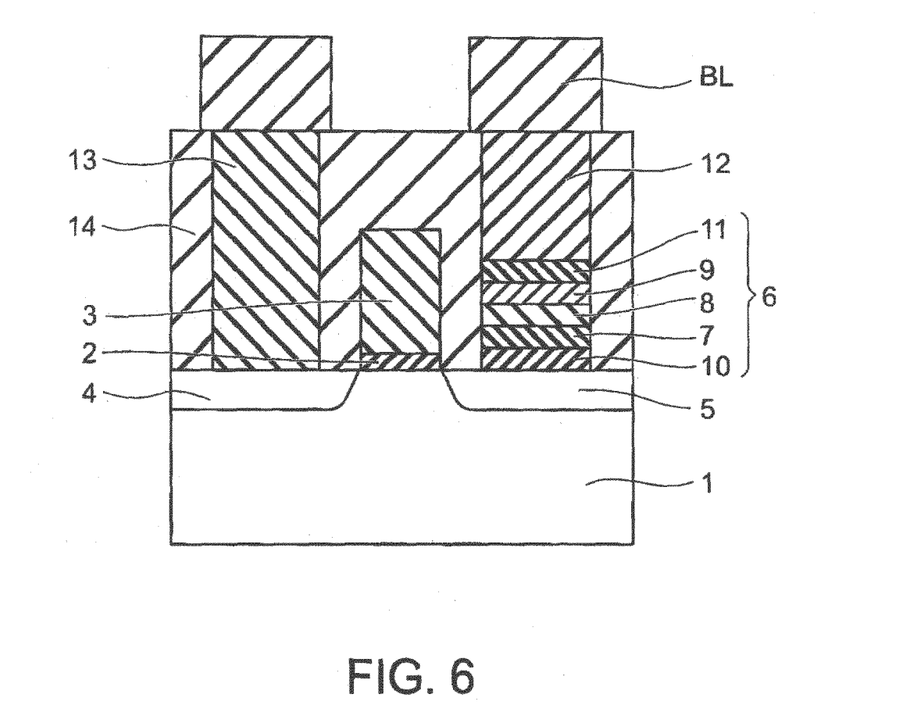
FIG. 6 is a sectional view showing the MRAM according to the third embodiment.

As shown in FIG. 6, bit lines BL are formed on the interlayer insulating film 14, the first contact plug 12 and the second contact plug 13. Then, an insulating film (not shown) is formed on the interlayer insulating film 14 to overlay the bit lines BL.

As described above, the magnetic random access memory is formed according to the third embodiment.

According to the magnetic random access memory in the third embodiment, as explained in details hereinabove, the magnetoresistive element 6 as a storage element is formed in direct contact on the drain diffusion layer 5, without a contact plug. This makes it possible to decrease parasitic resistances such as a contact resistance between a drain diffusion layer and a contact plug, a contact plug resistance itself, and a contact resistance between a contact plug and an electrode of the magnetoresistive element 6, and thus to lead to ensure enough current flowing to the magnetoresistive element 6 from the drain diffusion layer 5.

Furthermore, a selective transistor is formed without filling the gate insulating film 2 and the gate electrode 3 in the silicon substrate 1 according to the third embodiment. Consequently, since the manufacturing method of the magnetic random access memory according to the third embodiment decreases the number of process steps, the manufacturing cost can be reduced.

In addition, it is to be understood that this invention is not limited to the illustrative embodiments set forth hereinabove, and various modification and alterations will become apparent without departing form the scope of this invention.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the embodiments described herein maybe made without departing from the spirit of the inventions. The accompanying claims and their equivalents are intended to cover such forms or modification as would fall within the scope and spirit of the inventions.

What is claimed is:

1. A magnetic random access memory comprising:
   a semiconductor substrate including a surface region;
   a selective transistor having a gate electrode, a gate insulating film, a source and a drain; and
   a storage element formed on one of the source and the drain, including a magnetic storage layer, a magnetic reference layer, and a nonmagnetic layer formed between the magnetic storage layer and the magnetic reference layer, wherein a bottom surface of the storage element is directly in contact with one of the source and the drain.

2. The magnetic random access memory according to claim 1, wherein
the gate electrode is embedded in a groove formed at the surface region of the semiconductor substrate,
the gate insulating film is disposed on the bottom and side surfaces of the groove, the gate insulating film is disposed between the gate electrode and the semiconductor substrate,
the source and the drain are configured to sandwich the gate electrode and the gate insulating film therebetween at the surface region of the semiconductor substrate, and
an upper surface of the gate electrode and upper surfaces of the source and the drain are substantially in the same height.

3. The magnetic random access memory according to claim 1, wherein
the gate insulating film is formed on an upper surface of the semiconductor substrate,
the gate electrode is formed on the gate insulating film,
the source and the drain include a source diffusion layer and a drain diffusion layer, respectively, which formed at the surface region of the semiconductor substrate to sandwich the gate electrode therebetween, and a semiconductor layer formed on each of the source diffusion layer and the drain diffusion layer, and
an upper surface of the gate electrode and upper surfaces of the source and the drain are substantially in the same height.

4. The magnetic random access memory according to claim 1, wherein
the gate insulating film is formed on an upper surface of the semiconductor substrate,
the gate electrode is formed on the gate insulating film, and
the source and the drain have a source diffusion layer and a drain diffusion layer, respectively, which formed at the surface region of the semiconductor substrate to sandwich the gate electrode therebetween.

5. The magnetic random access memory according to claim 1 further comprising a barrier layer formed between one of the source and the drain and the storage element.

6. The magnetic random access memory according to claim 1, wherein
the storage element further includes a bottom electrode and a top electrode,
the bottom electrode is contacted to one of the source and the drain, and
the magnetic storage layer, the nonmagnetic layer and the magnetic reference layer are sequentially laminated between the bottom electrode and the top electrode.

7. The magnetic random access memory according to claim 1, wherein
the storage element further comprises a magnetic field canceling layer on the magnetic reference layer, the magnetic field canceling layer suppresses the magnetic influence on the magnetic storage layer by leak field from the magnetic reference layer.

8. The magnetic random access memory according to claim 7, wherein
the storage element further comprises an antiferromagnetic film on the magnetic field canceling layer, the antiferromagnetic film fixes the magnetization direction of the magnetic field canceling layer.

9. The magnetic random access memory according to claim 1, wherein
the storage element further comprises a first interface magnetic layer disposed between the magnetic storage layer and the nonmagnetic layer, and a second interface magnetic layer disposed between the magnetic reference layer and the nonmagnetic layer.

10. The magnetic random access memory according to claim 1, wherein
a magnetization direction of the magnetic storage layer is substantially perpendicular to a film surface of the magnetic storage layer, and a magnetization direction of the magnetic reference layer is substantially perpendicular to a film surface of the magnetic reference layer.

11. The magnetic random access memory according to claim 1, wherein
a magnetization direction of the magnetic storage layer is substantially parallel to a film surface of the magnetic storage layer, and a magnetization direction of the magnetic reference layer is substantially parallel to a film surface of the magnetic reference layer.

12. The magnetic random access memory according to claim 1, wherein a magnetization direction of the magnetic storage layer is variable and a magnetization direction of the magnetic reference layer is fixed.

13. A magnetic random access memory comprising:
a semiconductor substrate including a surface region;
a selective transistor having a gate electrode, a gate insulating film, a source and a drain; and
a storage element formed on one of the source and the drain, including a magnetic storage layer, a magnetic reference layer and a nonmagnetic layer formed between the magnetic storage layer and the magnetic reference layer, wherein the gate electrode is embedded in a groove formed at the surface region of the semiconductor substrate, the gate insulating film is disposed on the bottom and side surfaces of the groove, the gate insulating film is disposed between the gate electrode and the semiconductor substrate, and
the source and the drain are configured to sandwich the gate electrode and the gate insulating film therebetween at the surface region of the semiconductor substrate.

14. The magnetic random access memory according to claim 13 further comprising a barrier layer formed between one of the source and the drain and the storage element.

15. The magnetic random access memory according to claim 13, wherein
the storage element further includes a bottom electrode and a top electrode,
the bottom electrode is contacted to one of the source and the drain, and
the magnetic storage layer, the nonmagnetic layer and the magnetic reference layer are sequentially laminated between the bottom electrode and the top electrode.

16. The magnetic random access memory according to claim 13, wherein
the storage element further comprises a magnetic field canceling layer on the magnetic reference layer, the magnetic field canceling layer suppresses the magnetic influence on the magnetic storage layer by leak field from the magnetic reference layer.

17. The magnetic random access memory according to claim 16, wherein
the storage element further comprises an antiferromagnetic film on the magnetic field canceling layer, the antiferromagnetic film fixes the magnetization direction of the magnetic field canceling layer.

18. The magnetic random access memory according to claim 13, wherein the storage element further comprises a first interface magnetic layer disposed between the magnetic storage layer and the nonmagnetic layer, and a second interface magnetic layer disposed between the magnetic reference layer and the nonmagnetic layer.

19. The magnetic random access memory according to claim 13, wherein
a magnetization direction of the magnetic storage layer is substantially perpendicular to a film surface of the magnetic storage layer, and a magnetization direction of the magnetic reference layer is substantially perpendicular to a film surface of the magnetic reference layer.

20. The magnetic random access memory according to claim 13, wherein
a magnetization direction of the magnetic storage layer is substantially parallel to a film surface of the magnetic storage layer, and a magnetization direction of the magnetic reference layer is substantially parallel to a film surface of the magnetic reference layer.

21. The magnetic random access memory according to claim 13, wherein
an upper surface of the gate electrode and upper surfaces of the source and the drain are substantially in the same height.

22. The magnetic random access memory according to claim 13, wherein
a magnetization direction of the magnetic storage layer is variable and a magnetization direction of the magnetic reference layer is fixed.

23. A magnetic random access memory comprising:
a semiconductor substrate including a surface region;
a selective transistor formed at the surface region of the semiconductor substrate, and having a gate electrode, a gate insulating film, a source and a drain; and
a storage element formed on one of the source and the drain, including a magnetic storage layer in which a magnetization direction is variable, a magnetic reference layer in which a magnetization direction is fixed, and a nonmagnetic layer formed between the magnetic storage layer and the magnetic reference layer, wherein
the gate insulating film is formed on an upper surface of the semiconductor substrate,
the gate electrode is formed on the gate insulating film, and
the source and the drain have a source diffusion layer and a drain diffusion layer, respectively, which formed at the surface region of the semiconductor substrate to sandwich the gate electrode therebetween.

24. The magnetic random access memory according to claim 23, wherein
the source and the drain further include semiconductor layers formed on each of the source diffusion layer and the drain diffusion layer, and
an upper surface of the gate electrode and upper surfaces of the source and the drain are substantially in the same height.

25. A magnetic random access memory comprising:
a semiconductor substrate including a surface region;
a selective transistor formed at the surface region of the semiconductor substrate, and having a gate electrode, a gate insulating film, a source and a drain; and
a storage element formed on one of the source and the drain, including a magnetic storage layer in which a magnetization direction is variable, a magnetic reference layer in which a magnetization direction is fixed, and a nonmagnetic layer formed between the magnetic storage layer and the magnetic reference layer, wherein
the storage element further includes a bottom electrode and a top electrode,
the bottom electrode is contacted to one of the source and the drain, and
the magnetic storage layer, the nonmagnetic layer and the magnetic reference layer are sequentially laminated between the bottom electrode and the top electrode.

26. A magnetic random access memory comprising:
a semiconductor substrate including a surface region;
a selective transistor formed at the surface region of the semiconductor substrate, and having a gate electrode, a gate insulating film, a source and a drain; and
a storage element formed on one of the source and the drain, including a magnetic storage layer in which a magnetization direction is variable, a magnetic reference layer in which a magnetization direction is fixed, and a nonmagnetic layer formed between the magnetic storage layer and the magnetic reference layer, wherein
the storage element further comprises a magnetic field canceling layer on the magnetic reference layer, the magnetic field canceling layer suppresses the magnetic influence on the magnetic storage layer by leak field from the magnetic reference layer.

27. The magnetic random access memory according to claim 26, wherein
the storage element further comprises an antiferromagnetic film on the magnetic field canceling layer, the antiferromagnetic film fixes the magnetization direction of the magnetic field canceling layer.

* * * * *